(12) United States Patent
Ni

(10) Patent No.: US 10,332,926 B2
(45) Date of Patent: Jun. 25, 2019

(54) STRUCTURE OF A READOUT CIRCUIT WITH CHARGE INJECTION

(71) Applicant: NEW IMAGING TECHNOLOGIES, Verrieres le Buisson (FR)

(72) Inventor: Yang Ni, Palaiseau (FR)

(73) Assignee: NEW IMAGING TECHNOLOGIES, Verrieres le Buisson (FR)

( * ) Notice: Subject to any disclaimer, the term of this patent is extended or adjusted under 35 U.S.C. 154(b) by 126 days.

(21) Appl. No.: 15/316,828

(22) PCT Filed: Jun. 12, 2015

(86) PCT No.: PCT/EP2015/063112
§ 371 (c)(1),
(2) Date: Feb. 7, 2017

(87) PCT Pub. No.: WO2015/189359
PCT Pub. Date: Dec. 17, 2015

(65) Prior Publication Data
US 2017/0213866 A1    Jul. 27, 2017

(30) Foreign Application Priority Data
Jun. 12, 2014  (FR) ..................... 14 55361

(51) Int. Cl.
*H04N 5/335* (2011.01)
*H01L 27/146* (2006.01)
(Continued)

(52) U.S. Cl.
CPC .. *H01L 27/14634* (2013.01); *H01L 27/14643* (2013.01); *H04N 5/3575* (2013.01);
(Continued)

(58) Field of Classification Search
CPC .................. H04N 5/3575; H01L 27/14634
(Continued)

(56) References Cited

U.S. PATENT DOCUMENTS

2007/0285545 A1 *  12/2007  Hsieh ................ H01L 27/14634
348/294
2012/0085888 A1    4/2012  Endo et al.

FOREIGN PATENT DOCUMENTS

EP          0434502 A1      6/1991

OTHER PUBLICATIONS

International Search Report in PCT/EP2015/063112 dated Sep. 2, 2015, with English translation. 4 pages.
(Continued)

*Primary Examiner* — Usman A Khan
(74) *Attorney, Agent, or Firm* — Womble Bond Dickinson (US) LLP

(57) ABSTRACT

The invention concerns a structure of a readout circuit, formed on a semiconductor substrate (1) of a first type, and intended to measure the charges received from an external charge source (2) external to the substrate (1) according to successive charge integration cycles, said structure comprising: an injection diode configured to inject, into the substrate (1), the charges received from the external charge source (2), a collector diode suitable for collecting, in the substrate (1), at least a portion of the charges injected by the injection diode and for accumulating said charges during an integration cycle, a charge recovery structure (7), configured to recover the charges accumulated in said collector diode, means for initializing the charge recovery structure (7) at the end of each integration cycle, by restoring the electrical potential of said charge recovery structure to an initial potential.

15 Claims, 6 Drawing Sheets

Figure 9:
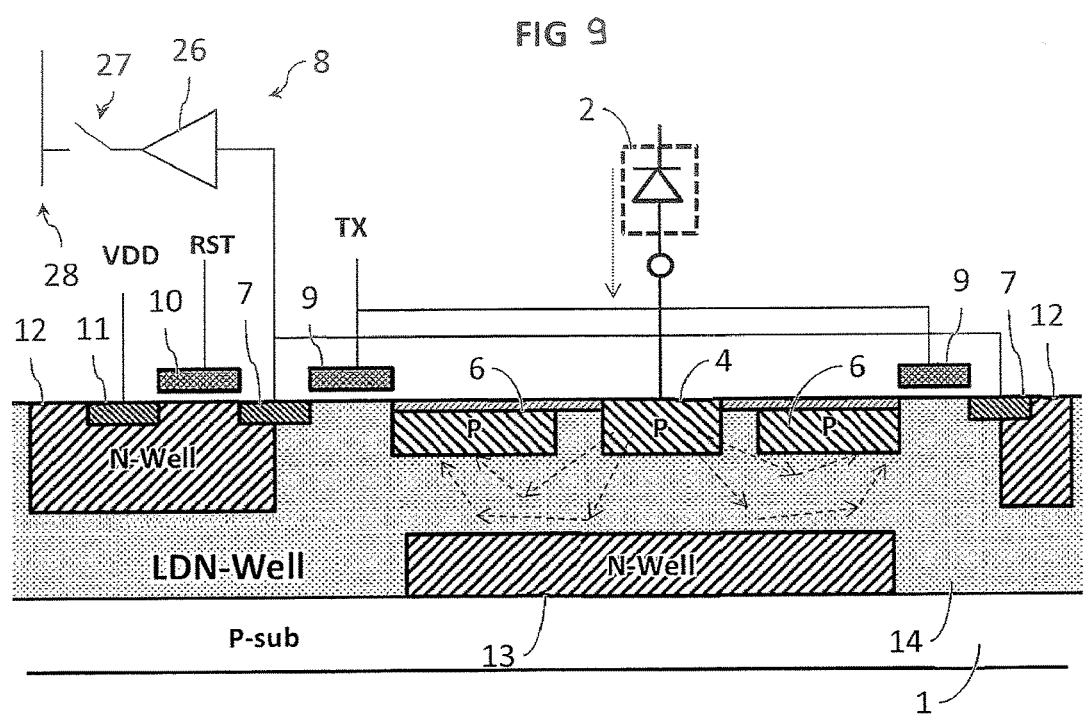

(51) Int. Cl.
*H04N 5/3745* (2011.01)
*H04N 5/357* (2011.01)
*H04N 5/363* (2011.01)
*H04N 5/378* (2011.01)

(52) U.S. Cl.
CPC ............ *H04N 5/363* (2013.01); *H04N 5/378* (2013.01); *H04N 5/3745* (2013.01); *H01L 27/14694* (2013.01); *H01L 2224/16225* (2013.01)

(58) Field of Classification Search
USPC .......................................................... 348/308
See application file for complete search history.

(56) References Cited

OTHER PUBLICATIONS

Krymski. "Estimates for Scaling of Pinned Photodiodes." IEEE Workshop on Charge-Coupled Devices and Advanced Image Sensors (2005). 16 pages.

Search Report in French Application No. 1455361 dated Jan. 28, 2015, with English translation coversheet. 3 pages.

* cited by examiner

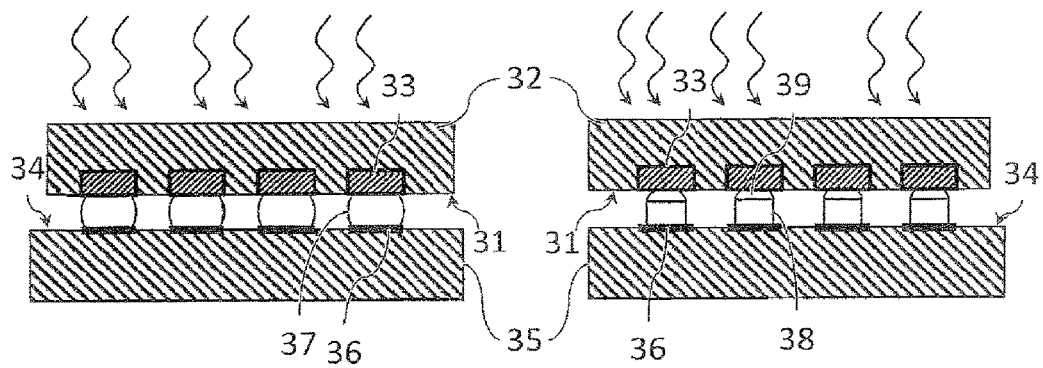
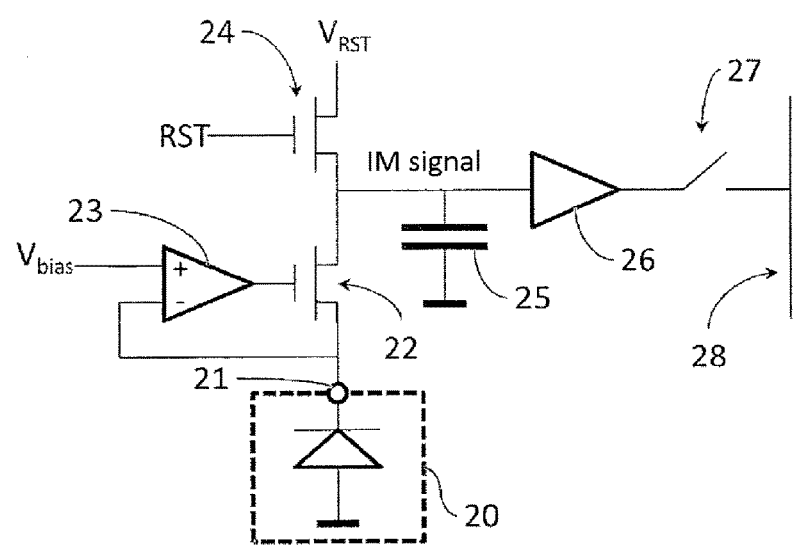
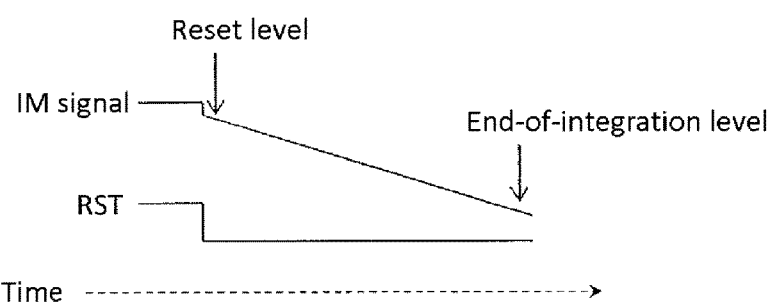

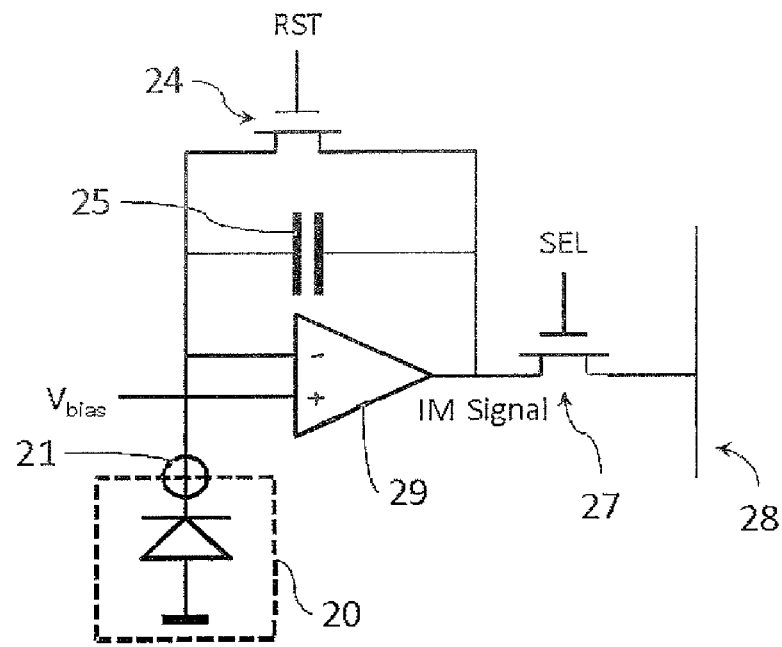
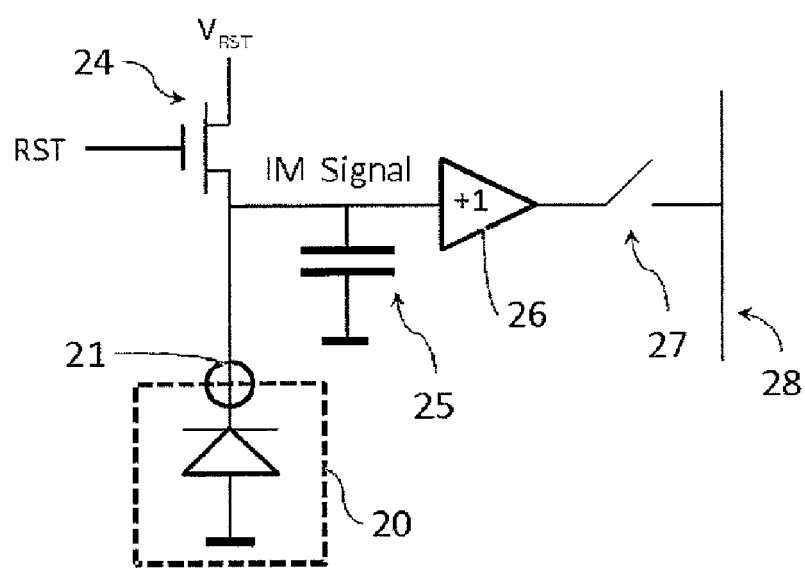

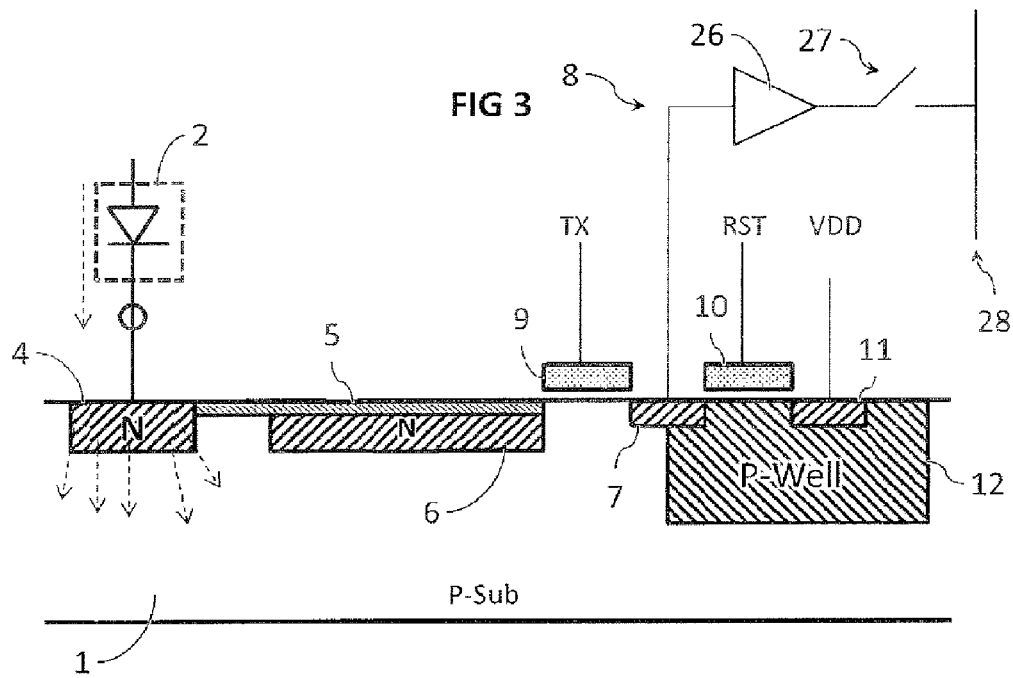
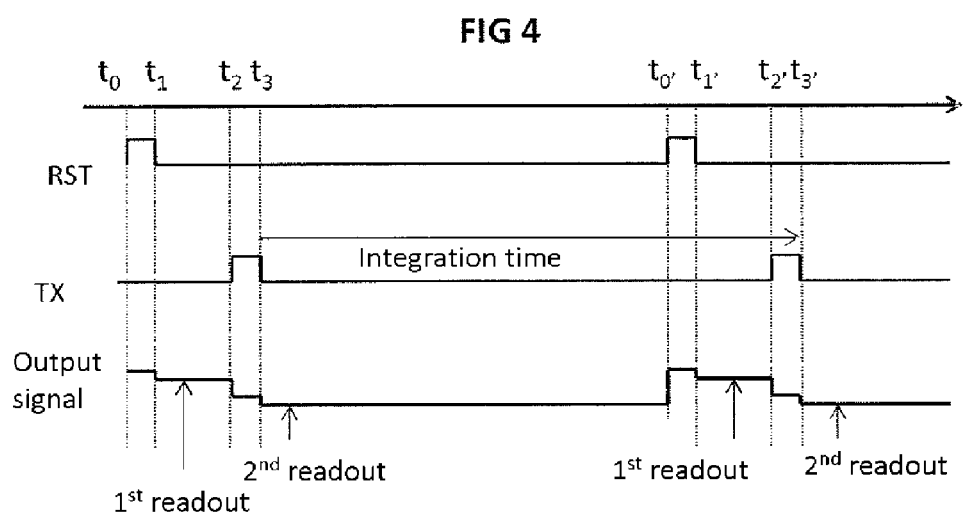

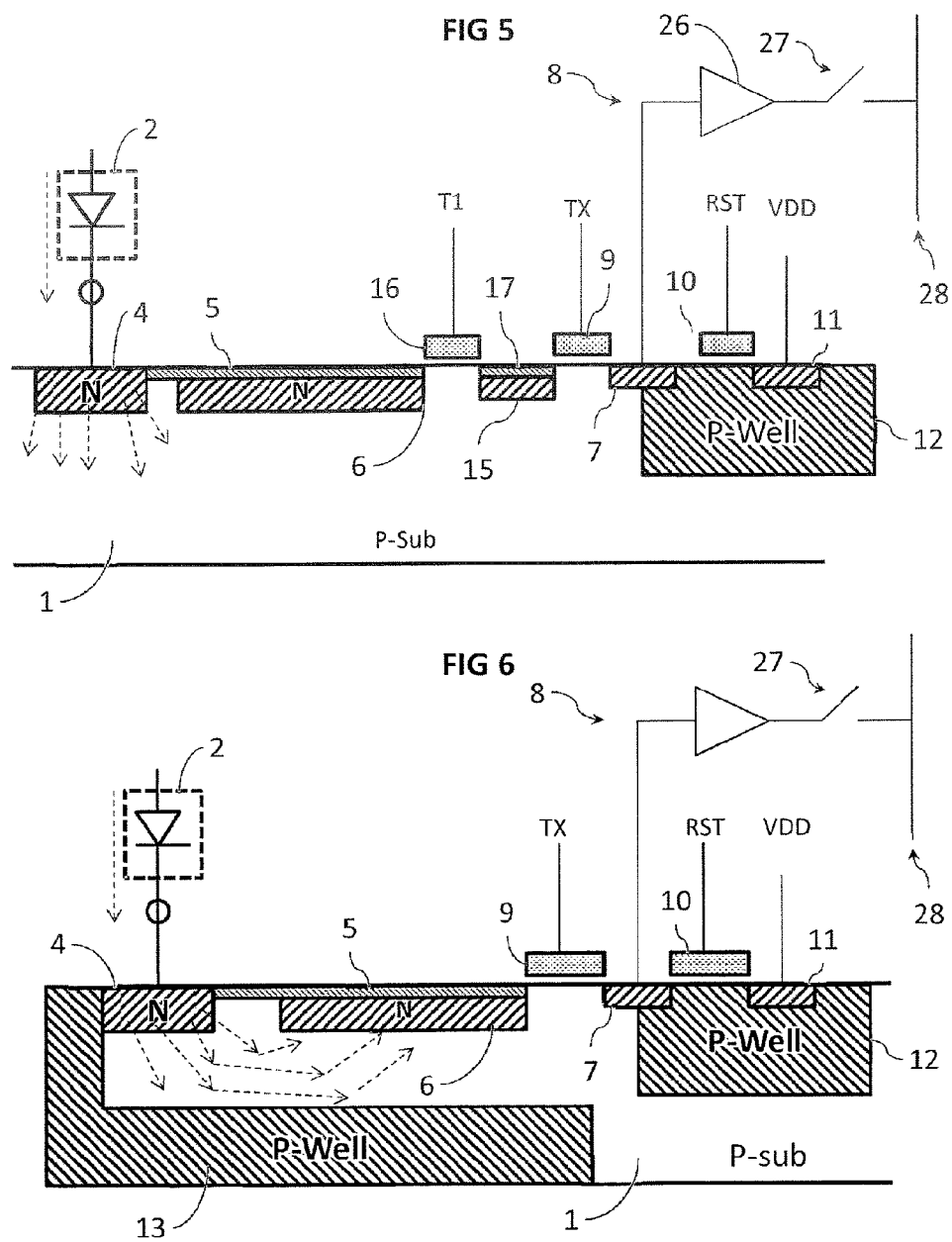

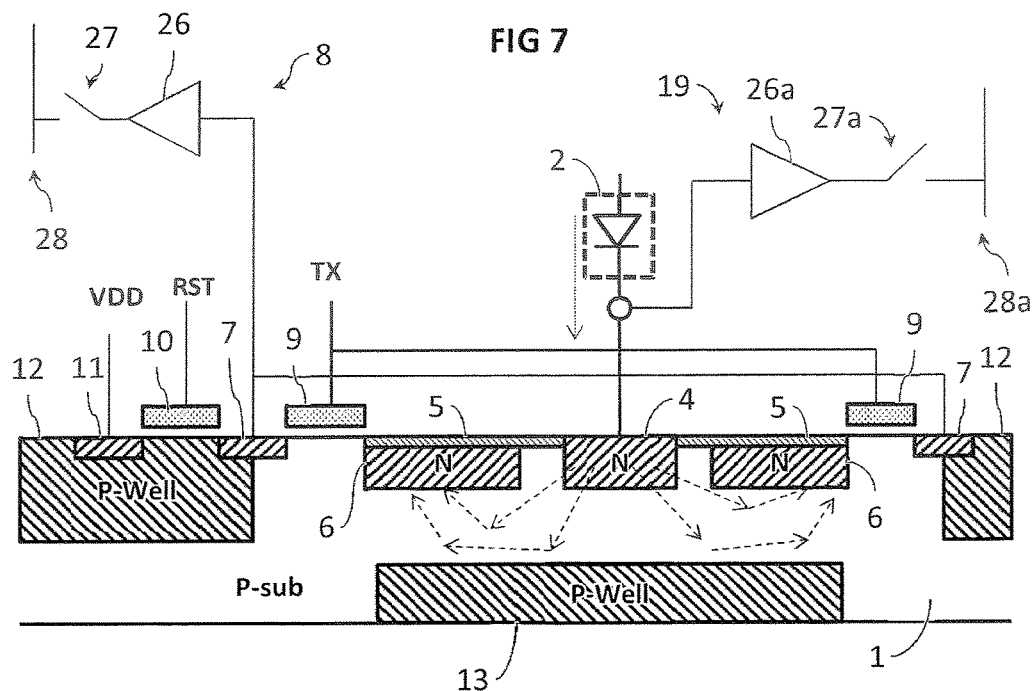
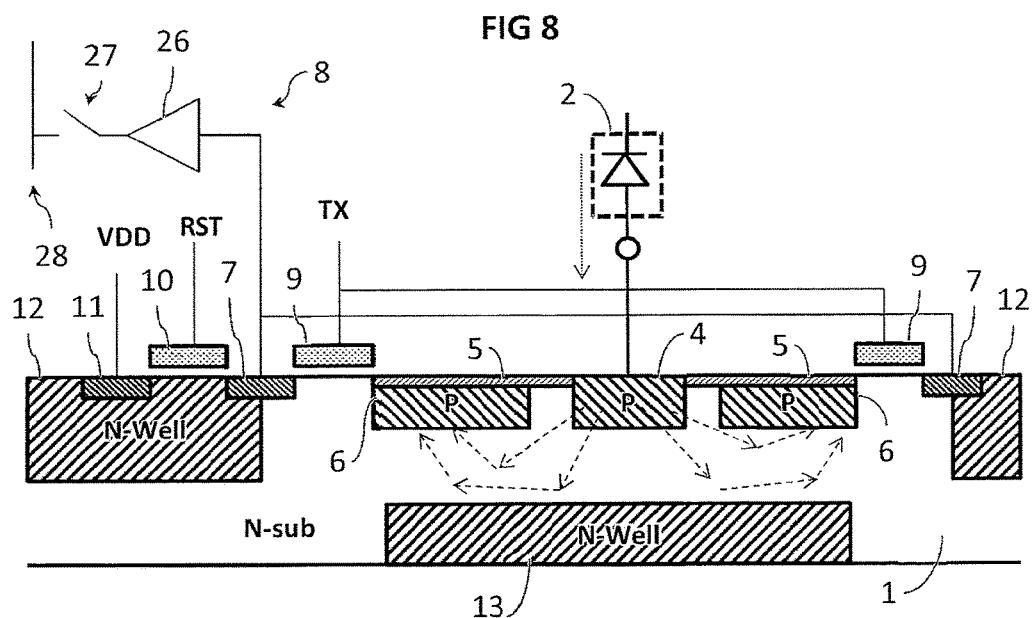

STRUCTURE OF A READOUT CIRCUIT WITH CHARGE INJECTION

FIELD OF THE INVENTION

The invention relates to a structure of a readout circuit for an electromagnetic sensor.

By "electromagnetic sensor" is meant in this text a sensor of electromagnetic radiation consisting of circuits for reading out pixels, each pixel comprising at least one photodiode for emitting an electric signal representative of the radiation to which the pixel is exposed. Such a sensor is made from a semi-conducting substrate (for example in silicon) in which the photodiodes are formed. The radiation intended to be utilized may for example be radiation in the visible spectrum, however, this is not limiting.

The electric signal emitted by each photodiode is read by a readout circuit (generally a respective readout circuit is dedicated to each photodiode for this purpose). The readout circuits are also formed in the silicon semi-conductor substrate.

The invention finds an advantageous application in hybrid sensors.

A sensor is said to be "hybrid" when the photodiodes are formed in a first substrate distinct from a second substrate which integrates the readout circuits and for which the semi-conductor material may differ from the material of the first substrate.

This is notably the case when the readout circuits are formed in a silicon substrate (which corresponds to the most common configuration for these readout circuits), while the photodiodes are often formed in a substrate in another material, for example indium-gallium arsenide (InGaAs), which gives the possibility of forming photodiodes sensitive to wavelengths suitable for night vision, to which a photodiode in a silicon substrate is not sensitive.

In the case of a hybrid sensor, each photodiode of the first substrate is connected to a readout circuit of the second substrate through a connection of the weld type, for example as an indium bead. FIGS. 1a and 1b show examples of possible configurations of this hybridization, according to the flip chip technique. According to this technique, the face 31 of the first substrate 32 at which are made the photodiodes 33, and the face 34 of the second substrate 35 at which is made the readout circuit 36, face each other. In a first example illustrated with FIG. 1a, each of the photodiodes 33 of the first substrate 32 is connected to the readout circuit 36 through an indium bead 37, while in the second example illustrated by FIG. 1b, the connection is made through a copper pillar 38 leaving the second substrate 35 and by a weld 39 between this pillar 38 and the photodiode 33.

BACKGROUND OF THE INVENTION

The reading out of the signals from the photodiodes is achieved at a given frequency, which is generally the same frequency for all the photodiodes. For example for video applications, the frequency may be 50 or 60 Hertz. For fast or ultra-fast acquisition applications, the frequency is higher.

The reading out of the photodiodes is thus accomplished with "cycles", each cycle corresponding to the integration time of the pixel, i.e. to the time during which the electric charge (formed with charges of the electrons or of the holes, depending on the nature of the photodiode) generated by the photodiode is accumulated either in the photodiode or in the readout circuit, as well as at the reading out time of the pixel.

The readout circuit of the photodiode may be achieved in different ways, in CMOS technology. It may notably be of the "direct injection" (DI), "Capacitive Trans-Impedance Amplifier" (CTIA), or "source follower per pixel" (SFP) type. These three types of readout circuits are illustrated in FIGS. 2a to 2c.

FIG. 2a illustrates an example of an electrical diagram of a circuit for reading out pixels of the direct injection type in a hybrid configuration. An amplifier 23 associated with a transistor 22 stabilizes the bias voltage applied to the photodiode 20 via the hybridization contact 21 between the first substrate on which is made the photodiode 20 and the second substrate on which is made the readout circuit. An initialization transistor 24 is controlled by an initialization signal RST in order to apply on the output of the transistor 22 an initialization voltage $V_{RST}$. An integration capacitor 25 is adapted for integrating the photo-current emitted by the photodiode 20. A buffer amplifier 26 gives the possibility of sending the voltage Signal IM to the terminals of this integration capacitor 25 towards a scanning multiplexing bus 28, via a selection switch 27.

A readout cycle comprises:
1) initializing the integration capacitor 25 by means of the initialization transistor 24,
2) integrating photoelectric charges generated by said photodiode 20 into the capacitor 25,
3) reading out the voltage Signal IM on the terminals of the capacitor 25 via the control of the switch 27.

The result of the readout may either be directly outputted to the readout circuit so as to be utilized, or be stored in a memory present in each pixel in order to be utilized subsequently.

The resetting of the integration capacitor 25 and of the photodiode 20 however produces so a called "KTC" electronic noise, K designating the Boltzmann constant, T the temperature in Kelvins and C the capacitance of the integration capacitor 25, with reference to the quantities having an influence of this noise. After initialization, the residual charge in the integration capacitor 25 has a random variation, the quadratic average of which has the value $\sqrt{KTC}$.

Thus, this KTC noise is expressed by a deviation error of the voltage on the terminals of the integration capacitor 25 with respect to the reset voltage $V_{RST}$.

In order to suppress this switching noise, a strategy was developed combining two readings out of voltage at the outlet of the pixel: this is therefore a correlated double readout, also known under the acronym of CDS for "Correlated Double Sampling".

A first readout is achieved at the beginning of a cycle, immediately after the capacitor has been reset into an initial step (reset—term which will sometimes be used by convenience and which should be considered as equivalent), by setting to a reference potential. This first readout gives a first read value of the initial amount of charges in the capacitor.

The second readout is achieved at the end of a cycle, when the capacitor is charged and reading the value of the accumulation of the integrated charges is desired.

Once both readouts are carried out and the cycle ending, comparison and computing means establish the difference between both read values. This difference gives the amount of charges generated by the photodiode which was integrated by the capacitor during the integration time.

These circuits and methods of known types thus give the possibility of determining, by computing the difference between a readout at the beginning of a cycle and a readout at the end of a cycle, for each photodiode and for each cycle, of a value of the amount of integrated charges into the capacitor from the photodiode during the integration cycle.

However, other sources of noise exist in a readout circuit of a photodiode. Now, for most of these noises, there is no correlation between the first readout and the second readout. Thus, not only these other noises are not suppressed, but further their spectral power density is increased by a factor 2.

For a CMOS (Complementary Metal Oxide Semiconductor) readout circuit, so called 1/f electronic noise is the dominating noise in all the active components such as the transistors. The power spectral density of this 1/f noise decreases with frequency. Thus, at a low frequency, the 1/f noise is significant. Now, the frequency of the operating cycles of the pixel is of the order of 50 Hz, which is expressed by a significant 1/f noise which limits the efficiency of the correlated double-sampling.

In order to reduce the 1/f noise relatively to direct injection, another type of circuit a so called CTIA, "Capacitive Trans-impedance Amplifier", a schematic example of which is illustrated by FIG. 2b.

The principle is similar to that of a direct injection circuit, with similar elements designated with the same numerical references. The photo-current from the photodiode 20 is integrated in the capacitor 25 through an operational amplifier 29 provided with a capacitive feedback. The initialization is accomplished by emptying the charges in the capacitor 25 by means of the initialization transistor 24 connected in parallel. The bias voltage of the photodiode 20 is maintained by means of the large gain of the operational amplifier 29.

The basic principle of this configuration is that the capacitive feedback attenuates the low frequency noise and that the efficiency of the correlated double sampling thereof is thus improved. The readout sequence is the same as that of a pixel with direct injection: a first readout is made after resetting and a second readout is made after the integration time, the image signal being formed by the difference between both of these samplings.

Inspite of the complexity of the pixel, the 1/f noise remains significant. Indeed, the best readout circuits CTIA cannot be lowered below a noise level corresponding to the charge of 40 to 50 electrons, for a very low capacitance value (5 to 10 fF). In such a configuration, the dynamics of the circuit are very low, and it easily saturates when the light exposure becomes too significant.

Another configuration is a so called SFP configuration "Source Follower per Pixel", FIG. 2c of which shows an exemplary embodiment. This configuration aims at reducing the number of transistors in order to reduce the number of 1/f noise sources.

The operating cycle is the same as a circuit for reading out a pixel Di or CTIA, and the similar elements of these circuits are designated with the same numerical references. In a pixel readout circuit SFP, the integration of the photo-current from the photodiode 20 is directly achieved on the integration capacitor 25 of the photodiode, including a few parasitic capacitances. The strong capacitive value of the photodiode 20 reduces the amplitude of the signal read as a voltage. The noise of the readout circuit finally limits the noise level added to the photodiode 20 with a number of electrons. For example, a circuit for reading out a pixel CTIA may operate with a capacitance of 5 fF for the integration capacitor, and for a readout noise with an amplitude of 320 µV, the noise level is thus equivalent to the electric charge of 10 electrons. In an SFP pixel readout circuit, the integration capacitance may with difficulty be less than 20 fF. In this case, the readout noise 320 µV is expressed by a noise equivalent to 40 electrons.

Another drawback for the correlated double sampling in each of these circuits is that the first readout takes place at the beginning of the integration cycle, while the second readout takes place at the end of the latter. Both readouts are therefore separated by quite a long time, comparable with the cycle time. The time separating both readouts of each cycle actually corresponds to the integration time, which is equal to the cycle time (to within the reset time). Now, between both of these readouts, electronic noises other than the KTC noise may perturb the measurement, like the 1/f noise, which may then, by its variations between two readouts, lead to erroneous values of charges (inferred from the difference of both read values). This is a penalty and will be all the more since the cycle time is long corresponding to low frequencies. As an illustration, an application which has a particular penalty by this limitation is vision in a low light level, which requires long cycle times, with frequencies of the order of 50 Hz.

Another limitation of these known circuits and methods is that they require that the value read at the beginning of a cycle be stored in a memory, so as to then carry out the comparison and subtraction operation at the end of the cycle. Therefore, a memory, for example an external memory or on the contrary in each pixel readout circuit, is therefore required for storing the first sampling during the integration time.

Application US 2007/0285545 has an active pixel in which a photodiode is connected to a node for collecting charges from an active pixel, maintained at a constant voltage and forming the drain of a transistor with constant bias, so that the charges are transferred to a charge integration node. This configuration however requires a dedicated transistor and does not give the possibility of properly depleting the integration region, thereby degrading the subsequent detection of the charges.

PRESENTATION OF THE INVENTION

The invention aims at giving the possibility of doing without these limitations and drawbacks. For this purpose, a readout circuit structure is proposed, formed on a semiconductor substrate of a first type, and intended to measure the charges received from a source of charges outside the substrate according to successive charge integration cycles, said structure comprising:

an injection diode formed in the substrate with a first PN junction comprising a first doped region of a second type of the substrate for receiving electric charges from said external source of charges, and configured for injecting into the substrate the charges received from the external source of charges, a collecting diode formed in the substrate by a second PN junction comprising a second doped region of the second type buried into the substrate and able to collect in the substrate at least one portion of the charges injected by the injection diode and of accumulating these charges during an integration cycle, a charge recovery structure, configured for recovering the charges accumulated in said collecting diode, means for initializing the charge recovery structure at the end of each integration cycle, by bringing back the electric potential of said charge recovery structure to an initial potential.

The structure is advantageously completed with the following features, taken alone or in any of their technically possible combinations:

the charge recovery structure comprises a floating diffusion node formed by a doped region of the second type in the substrate, connected to an output device;

the means for initializing the charge recovery structure comprise an initialization transistor, the gate of which, electrically insulated from the substrate, is located between said diffusion node and a reference potential source, and is adapted so as to be controlled for bringing the potential of said diffusion node to said initial potential;

the structure comprises a transfer transistor of the MOS type, the transfer gate of which is located between said buried diode and said floating diffusion node, above and electrically insulated from the substrate, and which may be controlled for transferring the charges collected in the second doped region towards the floating diffusion node;

the charge recovery structure comprises
a memory formed by a doped region of the second type and
a floating diffusion node formed by a doped region of the second type connected to an output device,
said memory being formed in the substrate between the buried diode and the floating diffusion node;

an output device is connected between the external source of charges and the injection diode in order to allow readout of the voltage on the terminals of the injection diode and thus obtain a logarithmic readout of the current passing between the external source of charges and the injection diode;

the structure comprises a confinement area formed by a doped region of the first type formed in the substrate, said confinement area extending in the depth of the substrate at least facing the first doped region making up the injection diode;

the confinement area further extends towards the surface of the substrate as far as the periphery of the injection diode;

the structure comprises a doped region of the first type formed in the substrate which surrounds a doped region of the second type of the initialization means, said doped region of the second type being connected to a reference potential source, and said doped region of the first type extending as far as a doped region of the second type belonging to the charge recovery structure;

the whole charge recovery assembly comprises a plurality of second doped regions of the second type buried in the substrate each forming a buried diode with said substrate, able to capture in the substrate at least one portion of the charges injected by a common injection diode, and of accumulating these charges during a cycle for integration of charges;

the injection diode is formed with a plurality of first doped regions of the second type electrically linked together;

the second doped region of the buried collecting diode is configured so as to be completely depleted at the end of the charge transfer towards the charge recovery structure.

The invention relates to a method for operating a readout circuit structure according to any one of the preceding claims, wherein:

a first readout of the voltage at the charge recovery structure is carried out after initializing said charge recovery structure and before transferring the charges from the buried diode towards said charge recovery structure, and a second readout of the voltage at the charge recovery structure is carried out after transferring the charges from the buried diode towards said charge recovery structure, the image signal corresponding to the difference between the first readout and the second readout.

The invention also relates to an array readout circuit comprising a plurality of readout circuit structures according to the invention.

The invention also relates to a hybrid sensor comprising a first substrate on which is formed a readout circuit according to the invention, and a second substrate on which is formed an array of elements sensitive to electromagnetic radiation forming the external sources of charges, for example photodiodes. The readout circuit and the array of sensitive elements may be connected through a connection in a configuration according to the flip chip technique.

PRESENTATION OF THE FIGURES

The invention will be better understood, by means of the description hereafter, which relates to embodiments and alternatives according to the present invention, given as non-limiting examples and explained with reference to the appended schematic drawings, wherein:

FIGS. 1a and 1b, already commented upon, illustrate examples of possible configurations of a hybrid sensor, according to the flip chip technique;

FIGS. 2a, 2b and 2c, already commented upon, illustrate examples of readout circuits of the photodiode in a CMOS technology, belonging to the state of the art;

FIG. 3 schematically illustrates a readout circuit structure according to a possible embodiment of the invention;

FIG. 4 schematically illustrates the operating cycle of the structure of FIG. 3;

FIGS. 5 to 9 schematically illustrate a readout circuit structure according to possible embodiments of the invention.

In the figures, similar elements are designated with the same numerical references.

DETAILED DESCRIPTION

The description which follows is in a first phase made with reference to a readout circuit structure formed on a semi-conductor substrate of the P type. However, the invention is not limited to this embodiment which only has an illustrative nature.

With reference to FIG. 3, the readout circuit structure formed on a semi-conductor substrate 1 of type P (P-sub). The substrate 1 has different doped regions forming elements of the readout circuit structure. The active readout circuit structure is intended to measure the charges received from a source of charges 2 outside the substrate 1. This source of charges 2 is a photodiode made on a second substrate different from substrate 1 on which is made the readout circuit structure. Notably, this external source of charges 2 may be made on a second substrate like in the hybrid configurations of the type of those illustrated by FIGS. 1a and 1b. The external source of charges 2 may also be a current source of a type other than a photodiode.

A PN junction is formed in a first doped region 4 of the substrate 1 in order to receive electric charges from the source of charges 2 outside the substrate 1. The first doped region 4 of the substrate is N-doped. The source of charges 2 is connected to the injection PN junction 4, for example via a hybridization contact 3 formed by a connection of the weld type, like in the examples of FIGS. 1*a* and 1*b*. The PN junction therefore receives the electric current generated by the source of charges 2 outside the substrate 1.

The first PN junction is forward biased so as to be able to inject into the substrate 1 the charges received from the source of charges 2 outside the substrate 1. The first PN junction thus forms a charge injection diode in the substrate 1. The injection of charges into the substrate 1 by the injection diode is illustrated by arrows in dashed lines in FIG. 3. Subsequently, there will be no distinction made between the diode and the doped region which forms with the substrate a PN junction.

In the case of a substrate 1 of the P type and of a first doped region 4 of type N, the injected charges are electrons, and the number of free electrons thereby injected into the substrate 1 is proportional to the product between the injection time and the electric current circulating between the photodiode 2 and the first doped region 4.

The structure of the readout circuit comprises a second PN junction comprising a second doped region 6 of the second type, buried in the substrate, and forming with the latter a buried collecting diode, able to collect in the substrate 1 at least one portion of the charges injected by the injection diode and to accumulate these charges for a charge integration cycle.

The distance between the second doped region 6 and the first doped region 4 is less than the diffusion length of the electrons in the substrate 1 at a rated temperature of use, for example at 20° C., and is preferably less than 150 µm. There is no transistor between the first doped region 4 and the second doped region 6: they are separated by substrate 1. The charges are injected into the substrate 1 at the first doped region 4 and diffused into said substrate 1. The charges are then collected by the second doped region 6. The injected charges pass through the depth of the substrate 1 so as to be collected by the second doped region.

The PN junction formed around this second buried doped region 6 and the penetration depth of the depletion area in the latter depends on the doping and on the bias voltage of the second doped region 6. When the depletion area invades the whole of this second doped region 6, there are no longer any mobile charges, i.e. no free electrons in the case of a second doped region 6 of the N type. The only charge remaining in this second doped region 6 is then the fixed charge, positive in the case of a second N type, left by the doping atoms.

The second doped region 6 is buried into the substrate 1 so that the space charge area (also called depletion area) of the junction between said second doped region 6 and the substrate 1 does not attain the surface of the substrate 1 when said doped region 6 is without any mobile charges.

In this respect, a doping surface area 5 of the first type, in this case a P type, may be provided between the doped region 6 of the buried collecting diode and the surface of the substrate 1, in order to prevent the depletion area from attaining this surface.

The article "Estimates for Scaling of Pinned Photodiodes" of Alex Krymski et al., 2005 IEEE Workshop on Charge-Coupled Devices and Advanced Image Sensors gives further details on this point.

Once free of free charges, the potential of the second doped region 6 no longer varies, but may always attract mobile charge carriers, in this case electrons in the case of a second N-doped region. Thus, if carriers of free charges are generated or injected in proximity to this second doped region 6, they may be attracted and fixed therein. The second doped region 6 may also play the role of an integrator without any initial residual charge. In the initial condition after the transfer of charges, the potential to which is subject the second doped region 6 is maximum, and decreases gradually during the collection of the charges injected by the injection diode.

Therefore, the second doped region 6 of the second type making up the buried collecting diode is configured (via its positioning, its dimensions and the concentrations of dopants) so as to be completely depleted at the end of the charge transfer towards the charge recovery structure. It should further be noted that the completely depleted aspect of the second doped region 6 of the buried collecting diode gives the possibility of suppressing the KTC noise.

The readout circuit structure also comprises a charge recovery structure configured for recovering the charges accumulated in said collecting diode.

Like the example illustrated by FIG. 3, this recovery structure may comprise a floating diffusion node 7 formed by a doped region of type N in the substrate 1, connected to an output device 8, said doped region of type N having a greater concentration of dopants than that of the second doped region 6 of type N forming with the substrate 1 the buried collecting diode.

The charge recovery structure also comprises a transfer transistor of the MOS type for which the transfer gate 9 is located between said buried collecting diode and said floating diffusion node 7. The gate 9 is above and electrically insulated from the substrate 1, and may be controlled by a transfer signal TX for transferring the charges which are accumulated in the second doped region 6 of the buried diode towards the charge recovery structure, here the floating diffusion node 7.

Thus as illustrated by FIG. 5, the charge recovery structure may also comprise a memory formed by a doped region 15 of the second type, i.e. N, formed in the substrate 1 between the buried collecting diode and the floating diffusion node 7 connected to the output device 8. This doped region 15 is buried like the second doped region 6, and for this purpose, a doping surface area of the first type, i.e. P, insulates said doped region 15 from the surface of the substrate 1. A transistor gate 16 controlled by a signal T1 may control the transfer of the charges from the buried collecting diode towards the memory, while the gate 9 of the transfer transistor is used for controlling the transfer of the charges from the memory towards the floating diffusion node 7. It should be noted that the memory has a greater dopant concentration of type N than that of the second doped region 6, but less than that of the floating diffusion node 7, in order to have a specific potential gradient for allowing transfer of the charges. Several memories may be positioned similarly between the buried collecting diode and the floating diffusion node 7 connected to the output device 8.

The output device 8, through which the output signal may transit, resulting from the readout of the voltage at the charge recovery structure, may comprise an amplifier 26 and a selection switch 27 connected to the amplifier 26, said selection switch 27 may be selectively controlled in order to connect the output of the amplifier 26 to a multiplexing bus 28.

The readout circuit structure also comprises means for initializing the charge recovery structure before transfer of charges, by reducing the electric potential of said charge recovery structure to an initial potential greater than the potential at which the second doped region 6 is completely depleted (called a "pinning voltage"), so that when the gate 9 of the transfer transistor allows transfer of the charges accumulated in the second doped region 6 of the buried diode.

Like the example illustrated by FIG. 3, the means for initializing the charge recovery structure may comprise an initialization transistor for which the gate 10 is located between the floating diffusion node 7 and a reference potential VDD source. The gate 10 is electrically insulated from the substrate and may be controlled for bringing the potential of said floating diffusion node 7 to said initial potential.

The structure may comprise a doped region 12 of the first type formed in the substrate 1 (P-Well) which surrounds a doped region of the second type 11 of the means for initializing the charge recovery structure. This doped region 11 of the second type is connected to a reference potential VDD source, and said region 12 of the first type extends as far as a doped region of the second type 7 belonging to the charge recovery structure, typically the floating diffusion node 7.

FIG. 4 illustrates the operation of the readout circuit structure in the case when the first type is the P type, and when the second type is the N type, like in the example of FIG. 3. At time $t_0$, which corresponds to the end of the preceding integration cycle, the charge recovery structure, i.e. the floating diffusion node 7, is initialized by means of the initialization signal RST in the high state applied to the gate of the initialization transistor 10. The initialization transistor becomes conductive and the floating diffusion node 7 is then connected to the reference potential VDD source, thereby bringing it to an initial potential. This initial potential has a sufficient level so as to be able to cause a total transfer of the charges collected by the buried collecting diode 6 when an electric channel connects the collecting diode to the charge recovery structure.

Next, at instant $t_1$, the initialization signal RST applied to the gate of the initialization transistor 10 is reduced to a low level, so that the initialization transistor again becomes blocked.

At instant $t_2$, the transfer signal TX applied to the gate of the transfer transistor 9 is brought to a high level, so as to allow transfer of the charges accumulated in the second doped region 6 of the buried diode towards the charge recovery structure formed by the floating diffusion node 7, by establishing an electric channel in the underlying substrate to the gate of the transfer transistor 9.

The charges collected in the second doped region 6 of the collecting diode are then transferred towards the floating diffusion node 7 completely, so that the second doped region 6 is completely depleted at the end of this transfer. As indicated above, the depletion area of the PN junction of the buried diode completely covers the second doped region 6. The potential at the latter then corresponds to the so called "pinning voltage" potential, which depends on the configuration of the dopants.

At instant $t_3$, the transfer signal TX applied to the gate of the transfer transistor 9 is brought to a low level so as to make the transfer transistor blocked. A new cycle may then begin, the instants $t_0'$, $t_1'$, $t_2'$ and $t_3'$ of which respectively correspond to the instants $t_0$, $t_1$, $t_2$ and $t_3$.

A first readout of the signal via the output device 8 is made between the instants $t_1$ and $t_2$, and a second readout is made after $t_3$. The first readout gives information on the reset level, i.e. the initial potential level attained by the charge recovery structure after its initialization. The integration time, i.e. for collecting the charges injected by the buried collecting diode 6, corresponds to the interval between the instants $t_3$ and $t_3'$.

The voltage difference between the first readout and the second readout gives the sought image signal.

It should be noted that the intervals between the instants $t_0$ and $t_1$, as well as between the instants $t_2$ to $t_3$, are very short, of the order of a few nanoseconds to a few microseconds at the most, while the integration time is of the order of a few milliseconds. It is therefore ascertained that the charge transfer operation allows correlated double samplings very close together in time, since the first readout and the second readout occur respectively before and after the charge transfer, and are not separated by the integration time like in the configurations of the state of the art discussed earlier. The influence of the 1/f noise is therefore reduced as compared with these configurations.

FIG. 6 shows a readout circuit structure similar to the one of FIG. 3, with however the presence of a confinement area 13 formed by a doped region of the first type formed in the substrate 1, said confinement area 13 extending in the depth of the substrate 1 at least facing the first doped region 4 of the injection diode. As illustrated, the confinement area 13 may further extend towards the surface of the substrate 1 as far as the periphery of the injection diode.

This confinement area 13 gives the possibility of confining the charges injected by the injection diode in a region of the substrate 1 in which these charges may be attracted by the buried diode. In the case illustrated by FIG. 4, this confinement area 13 corresponds to a deep P-well which however leaves free a region of the substrate 1 between the injection diode and the buried diode.

FIG. 7 shows another configuration, in which the charge recovery assembly 5 comprises a plurality of second doped regions 6 of the second type buried in the substrate 1 each forming a buried diode with said substrate, able to capture in the substrate at least one portion of the charges injected by the common injection diode, and to accumulate these charges during a charge integration cycle. These buried diodes 6 in the substrate 1 are distributed around the injection diode 4, in different directions relatively to said injection diode.

Thus, in so far that the charges injected by the injection diode 4 may be collected in the different directions where these buried diodes 6 are positioned, there are less losses, and the collection of the injected charges is thereby improved.

In order to further improve the injection and the collection of the charges in the substrate 1, the injection diode 4 may be formed with a plurality of first doped regions of the second type electrically connected with each other. Preferably, as these first doped regions are located in proximity to at least one buried collecting diode 6, i.e. at a distance less than the diffusion length of the electrons in the substrate 1 at a rated temperature of use, for example at 20° C., and preferably less than 150 µm, or even 100 µm.

As visible in FIG. 7, the charge recovery assembly then comprises a plurality of charge recovery structures, for example floating diffusion nodes 7, each associated with a buried diode 6, and connected together to a same bus 8 for delivering the output signal. For each association between a charge recovery structure and a buried diode 6, a transfer transistor gives the possibility of controlling the transfer of the charges from the buried diode to the charge recovery structure. The gates 10 of the transfer transistors are controlled by the same transfer signal TX.

FIG. 8 shows another possibility for the readout circuit structure, which again assumes the configuration of FIG. 7, in which the first type is the N type and the second type is the P type. It should be noted that the same modification may be carried out for the configurations discussed with reference to FIGS. 3, 5 and 6. Accordingly, the substrate 1 is here of the N type, the first doped region 4 forming with the substrate the injection diode is of type P, the second doped region 6 forming with the substrate the buried diode is of the P type, the recovery structure has a P-doped region forming the floating diffusion node 7, and the confinement area 13 is of the N type.

In this case, the charge carriers injected by the photodiode 2 outside the substrate 1 are holes, which are then collected by the buried diode and then recovered by the recovery structure.

In this FIG. 7, an additional feature is indicated, for example a second output device 19 is connected on the branch for injection of the charges between the external source of charges 2 and the injection diode 4. This second output device 19 comprises an amplifier 26a connected through a selection switch 27a to a multiplexing bus 28a, which may be distinct or coincides with the multiplexing bus to which is connected the output device 8. The input impedance of the amplifier 26a is very large, ideally infinite, equivalent to that of a MOS transistor gate.

This second output device 19 gives the possibility of reading out the voltage on the terminals of the injection diode and thus gives the possibility of obtaining a logarithmic readout of the current generated by the external sources of charges 2 and injected into the substrate 1, via the exponential relationship between the voltage and the current passing from the external source of charges 2 to the injection diode. The possibility of a double readout mode is then obtained: linear and logarithmic, which improves the dynamics of the readout circuit structure since the latter may both react to low and strong light exposures.

However, the wafers of type P are more popular in a CMOS foundry. In order to be able to produce a pixel readout circuit according to the configuration in which the first type is the N type and the second type is the P type, it is possible to provide the achievement of the readout circuit structure in a well of the type N slightly doped ("LDN-Well" for "lightly-doped N-type well").

FIG. 9 shows such an example, with a well 14 of the lightly-doped N type formed in the substrate 1 of type P, in which is formed the whole of the doped regions mentioned earlier.

The invention is not limited to the embodiment described and illustrated in the appended figures. Modifications remain possible, notably from the point of view of the structure of the diverse elements or by substitution of technical equivalents, without however departing from the scope of protection of the invention.

The invention claimed is:

1. A readout circuit structure, formed on a semiconductor substrate of a first type, and intended to measure the charges received from a source of charges outside the substrate according to successive charge integration cycles, said structure comprising:

an injection diode formed in the substrate by a first forward biased PN junction comprising a first doped region of a second type of the substrate for receiving electric charges from said external source of charges, and configured for injecting into the substrate the charges received from the external source of charges, a collecting diode formed in the substrate by a second PN junction comprising a second doped region of the second type buried in the substrate and able to collect in the substrate at least one portion of the charges injected by the injection diode and of accumulating these charges during an integration cycle, a charge recovery structure, configured for recovering the charges accumulated in said collecting diode, means for initializing the charge recovery structure at the end of each integration cycle, by bringing back the electric potential of said charge recovery structure to an initial potential.

2. The readout circuit structure according to claim 1, wherein the charge recovery structure comprises a floating diffusion node formed by a doped region of the second type in the substrate, connected to an output device.

3. The readout circuit structure according to claim 2, wherein the means for initializing the charge recovery structure comprise an initialization transistor, the gate of which, electrically insulated from the substrate, is located between said diffusion node and a reference potential source, and is adapted so as to be controlled for bringing the potential of said diffusion node to said initial potential.

4. The readout circuit structure according to claim 2, comprising a transfer transistor of the MOS type, the transfer gate of which is located between said buried diode and said floating diffusion node, above and electrically insulated from the substrate, and which may be controlled for transferring the charges collected in the second doped region towards the floating diffusion node.

5. The readout circuit structure according to claim 1, wherein the charge recovery structure comprises:

a memory formed by a doped region of the second type and a floating diffusion node formed by a doped region of the second type connected to an output device, said memory being formed in the substrate between the buried diode and the floating diffusion node.

6. The readout circuit structure according to claim 1, wherein an output device is connected between the external source of charge and the injection diode in order to allow readout of the voltage on the terminals of the injection diode and thus obtain a logarithmic readout of the current passing between the external source of charge and the injection diode.

7. The readout circuit structure according to claim 1, comprising a confinement area formed by a doped region of the first type formed in the substrate, said confinement area extending in the depth of the substrate at least facing the first doped region making up the injection diode.

8. The readout circuit structure according to claim 7, wherein the confinement area further extends towards the surface of the substrate as far as the periphery of the injection diode.

9. The readout circuit structure according to claim 1, comprising a doped region of the first type formed in the substrate which surrounds a doped region of the second type of the initialization means, said doped region of the second type being connected to a reference potential source, and said doped region of the first type extending as far as a doped region of the second type belonging to the charge recovery structure.

10. The readout circuit structure according to claim 1, wherein the charge recovery assembly comprises a plurality of second doped regions of the second type buried in the substrate each forming a buried diode with said substrate, able to capture in the substrate at least one portion of the charges injected by a common injection diode, and of accumulating these charges during a charge integration cycle.

11. The readout circuit structure according to claim 10, wherein the injection diode is formed with a plurality of first doped regions of the second type electrically linked together.

12. The readout circuit structure according to claim 1, wherein the second doped region of the buried collecting diode is configured so as to be completely depleted at the end of the charge transfer towards the charge recovery structure.

13. A method for operating a readout circuit structure according to claim 1, wherein
- a first readout of the voltage at the charge recovery structure is carried out after initializing said charge recovery structure and before transferring the charges from the buried diode towards said charge recovery structure, and
- a second readout of the voltage at the charge recovery structure is carried out after transferring the charges from the buried diode towards said charge recovery structure, the image signal corresponding to the difference between the first readout and the second readout.

14. An array readout circuit comprising a plurality of readout circuit structures according to claim 1.

15. A hybrid sensor comprising a first substrate on which is formed a readout circuit according to claim 14, and a second substrate on which is formed an array of elements sensitive to electromagnetic radiation forming the external sources of charges.

* * * * *